United States Patent [19]

Anderson et al.

[11] Patent Number: 4,924,111

[45] Date of Patent: May 8, 1990

[54] MICROPROCESSOR LAYOUT MINIMIZING TEMPERATURE AND CURRENT EFFECTS

[75] Inventors: Floyd E. Anderson, Phoenix; Stephen P. Robb, Tempe, both of Ariz.

[73] Assignee: Motorola, Inc., Schaumburg, Ill.

[21] Appl. No.: 263,746

[22] Filed: Oct. 31, 1988

[51] Int. Cl.⁵ .............................................. H03K 17/12
[52] U.S. Cl. ................................ 307/270; 307/303.2; 307/310; 364/184
[58] Field of Search ........................ 307/310, 270, 303; 318/334, 782, 783, 473; 361/103, 106, 24; 364/141, 148, 557, 184

[56] References Cited

U.S. PATENT DOCUMENTS

| | | | |
|---|---|---|---|
| 3,777,240 | 12/1973 | Neill | 361/24 |
| 4,288,854 | 9/1981 | Burroughs | 364/557 |
| 4,453,094 | 6/1984 | Peil et al. | 307/270 |
| 4,547,826 | 10/1985 | Premerlani | 364/557 |
| 4,607,962 | 8/1986 | Nagao et al. | 364/557 |
| 4,771,845 | 9/1988 | Shimizu | 318/473 |
| 4,789,040 | 12/1988 | Morishita et al. | 361/24 |
| 4,791,380 | 12/1988 | Chiappetta | 307/310 |

Primary Examiner—David Hudspeth
Attorney, Agent, or Firm—Michael D. Bingham

[57] ABSTRACT

An integrated circuit having a microprocessor core interfaced to large power transistors is described. This integrated circuit provides the capability to intelligently control and drive loads requiring currents exceeding 250 milli amps. The large power transistors are built in a technology compatible with the microprocessor core technology resulting in a more readily manufacturable circuit. The microprocessor core is layed out in a manner which provides the greatest distance between the most heat sensitive microprocessor core circuits and the power devices. On chip temperature sensing and feedback is provided for junction temperature monitoring and control.

11 Claims, 3 Drawing Sheets

MICROPROCESSOR LAYOUT MINIMIZING TEMPERATURE AND CURRENT EFFECTS

FIELD OF THE INVENTION

This invention relates in general to the field of microprocessors and power devices and more particularly, to a microprocessor having large current drive capability, wherein integrated power devices are merged with the microprocessor core in a manner which minimizes the effects of heat and substrate currents on the microprocessor core's operation.

BACKGROUND OF THE INVENTION

Microprocessors, in the past, have been widely used to control and monitor devices operating at voltage and power levels which exceed the capabilities of the microprocessor itself. Typical examples include driving fractional horsepower DC motors and solenoids in consumer electronics, small industrial machines, automotive applications, robotic mechanical controls, etc. The use of the microprocessor as a controlling and monitoring device is extremely useful due to the flexibility and processing power of the microprocessor, and since often times the controlling input signals to the microprocessor are in digital form which are readily usable by the microprocessor. Further, the unique control program required to instruct the microprocessor may be stored in mask programmable Read Only Memory (ROM) or Electrically Programmable Read Only Memory (EPROM). Typically the outputs of the microprocessor, however, are limited to a voltage range equal to that of the microprocessor power supply, and to current drive capabilities in the range of 12 to 48 milliamps per output driver.

Further increases in output drive capability on the microprocessor is possible by using bipolar transistors in the output circuits. The majority of microprocessors currently being used are Complementary Metal Oxide Semiconductor (CMOS) due to the high transistor densities and low power consumption requirements. The bipolar devices, however, require a relatively large base drive current and additionally, several more masking steps in the manufacturing process. Also, bipolar devices require a large amount of silicon real estate and dissipate large amounts of power relative to several special purpose MOS power devices such as Lateral DMOS(LDMOS), Vertical DMOS(VDMOS), and Updrain DMOS(UDMOS). The high base drive current problem of the bipolar devices may be reduced somewhat by using Darlington transistor pairs in their place, but the requirements of large silicon area still exists and additionally undesirable forward voltage drops develop across the Darlington transistor pairs which make these devices unsuitable for many applications. If the bipolar output driver were driving 100 milliamps and the transistor fell into the linear region of operation from the saturation mode, the bipolar device would rapidly heat and likely destroy the microprocessor circuits. Integrated bipolar output transistors are therefor limited in their application due to cost and power dissipation considerations.

It would be advantageous to provide a special purpose microprocessor capable of providing high current output capabilities on chip. This could provide cost savings as well as decrease the package size relative to a microprocessor driving a separate power device. This provides the ability to place a single controlling-driver chip in areas where it is not currently feasible to place a multiplicity of chips due to interconnect and mounting problems. The microprocessor also has the ability to closely monitor the temperature of the power devices and take corrective action to avoid damage caused by overheating. Adding power drivers to the microprocessor requires solving problems of high temperature, high power dissipation, collecting excessive substrate currents, and providing high voltages than provided by the power supply. Additionally it is desirable to have a power device that is process compatible with an existing microprocessor technology in order to utilize an existing microprocessor design.

Thus, what is needed is a microprocessor having large current drive capability, wherein integrated power devices are merged with the microprocessor core in a manner which minimizes the effects of heat and substrate currents on the microprocessor core's operation.

SUMMARY OF THE INVENTION

Accordingly, it is an object of the present to provide an improved microprocessor layout having power devices controlled by a microprocessor core wherein the power devices are placed in a manner that does not adversely affect the operation of the microprocessor core.

It is another object of the present invention to provide a microprocessor layout having power devices controlled by a microprocessor core wherein the most heat sensitive circuits of the microprocessor core are protected from the power devices.

It is yet another object of the present invention to provide a guard ring on chip to separate the microprocessor core from the power devices and effectively collect parasitic substrate currents.

In carrying out the above and other objects of the invention in one form, there is provided an integrated circuit which integrates power output devices with a microprocessor core wherein the microprocessor core controls and drives the power output devices. The microprocessor core having a heat sensitive circuit, the circuit being more sensitive than substantially all other circuits within the microprocessor core, is located at a greater distance from the power output devices than the other circuits.

The above and other objects, features, and advantages of the present invention will be better understood from the following detailed description taken in conjunction with the accompanying drawings.

DETAILED DESCRIPTION OF THE INVENTION

Many circuit and system advantages can be realized by integrating a dedicated microprocessor core on the same substrate as that of large power drivers and their associated control circuits. In larger systems, the main controlling microprocessor may be allowed to spend more time on other system functions since it will not be required to spend as much CPU time instructing and monitoring the integrated microprocessor-power device due to the processing capabilities of the microprocessor-power device. Additionally, the integrated microprocessor-power device is able to monitor the substrate temperature and hence the operating temperature of the power driver portion of the integrated circuit directly since they share the same substrate. There are also the cost and speed advantages of the reduced packaging requirements.

Figure 1:
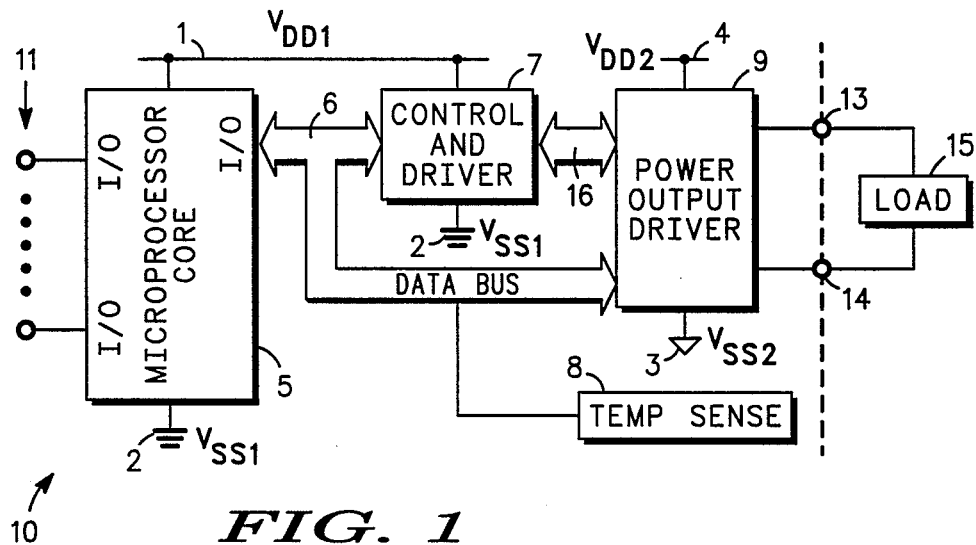
FIG. 1 is block diagram of a microprocessor core driving internal power output devices.

Referring to FIG. 1, a block diagram representation of a microprocessor-power integrated circuit 10 is shown. A microprocessor core 5 is connected to a VDD1 bus 1 and a ground supply bus 2 (VSS1). An internal data bus 6 connects a portion of the microprocessor core 5 to a control and driver circuit 7, a temperature sense circuit 8, and to a power output driver 9. The microprocessor core 5 is also connected to a plurality of input/output pads 11 for receiving control instructions from an external source. The power output driver 9 is connected to its own voltage supply busses VDD2 bus 4 and VSS2 bus 3, in order to minimize the effects of noise due to large current spikes through the power output driver 9 on the microprocessor core 5 voltage supply levels. The power output driver 9 is further connected to output terminals 13 and 14 for driving a load 15.

The microprocessor core 5 typically contains at least a minimum amount of processing and control circuitry, including a Central Processing Unit (CPU), CPU control circuit, Arithmetic Logic Unit (ALU), internal control registers, pointers, and program counters. This minimum configuration provides a microprocessor core with the ability to control, monitor, and change control based on instruction and feedback signals. The microprocessor core 5, for example, receives its control and feedback signals from both the plurality of input/output pads 11 and the internal data bus 6. The power and output driver 9 can receive digital signals directly from the microprocessor core 5 and send back status information via the data bus 6. Significantly more processing power is added to the microprocessor core 5 by the inclusion of additional circuits including Static Random Access Memory (SRAM), ROM, Analog to Digital Converters (ADC), and timers, etc.

The inclusion of SRAM and ROM allow the microprocessor core 5 to operate more independently from outside control since a control program may be stored in ROM and intermediate data may be stored in SRAM. In the present invention, an ADC is used in the microprocessor core to convert an analog signal from the temperature sense circuit 8 to a digital signal which may be processed by the microprocessor core 5 CPU. Still more versatility can be added by the inclusion of EPROM which allows the control program to be modified, or a new control program to be stored for new applications. An example of a microprocessor core currently available for use as the intelligent circuit control portion of the present invention is the Motorola 68HC05 microprocessor core.

In operation, the microprocessor-power integrated circuit 10 receives its external commands from the plurality of input/output pads 11. A typical example would be a command to the microprocessor-power integrated circuit 10 to drive a DC motor (load 15) in the forward direction. The control program stored in ROM would then direct the microprocessor core 5 to provide the correct sequence of signals to the internal data bus 6 which are then received by the control and driver circuit 7 and the power output driver 9. The control and driver circuit 7 is connected to the power output driver 9 by a driver bus 16 and has two basic functions which include providing a driver voltage whose magnitude can be greater than the magnitude of the voltage level of the VDD1 supply voltage, and providing the necessary current drive to turn the power output driver 9 on and off within a specified time interval. If the magnitude of the VDD1 supply voltage is greater than the magnitude of the VDD2 supply voltage, then the magnitude of the driver voltage may be equal to the VDD1 supply voltage and still achieve minimum rdson.

A typical method of providing a driver voltage having a magnitude greater than that of the supply voltage as in the control and driver circuit 7 is by the use of a charge pump. A charge pump is a circuit that uses voltage multiplication techniques to make available a voltage which is greater than the voltage sourcing the charge pump and is well understood by those skilled in the art. The charge pump voltage is used to power the rest of the control and driver circuits 7. Because the power output driver 9 is large, it is necessary to provide more drive than is typically available from a microprocessor core input/output bus (I/O). Also the power output driver 9 requires an overdrive voltage to minimize its rdson (the channel resistance of a transistor in the on state) when sinking and sourcing large currents. Hence the control and driver circuit 7 provides buffers having the necessary drive capability to sufficiently drive the power output driver 9. Furthermore the magnitude of the driver voltage reaches a magnitude equal to the magnitude of the charge pump voltage in order to provide the necessary overdrive.

Figure 2:
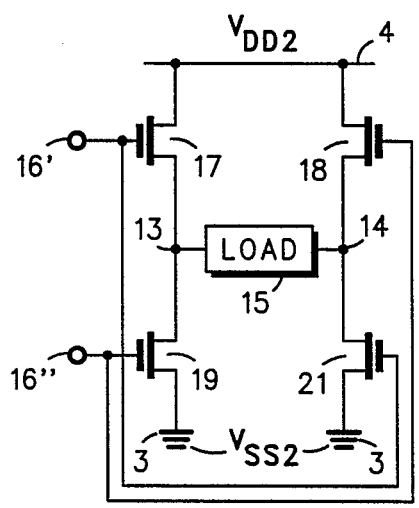
FIG. 2 is a schematic diagram of a power output driver configured as an H switch.

FIG. 2 depicts in schematic form the devices comprising the power output driver 9 as coupled to the load 15. Structures of FIG. 1 which are shown in FIG. 2 are identified by the numbers in FIG. 1. In a minimum configuration, a power output driver might comprise only a single power transistor giving it the capability to sink or source a single large current. The power output driver 9 shown in FIG. 2, however, utilizes four power devices configured as an H switch giving it the additional capability of driving a DC motor in both a forward and reverse direction. A power transistor 17 has a source connected to the VDD2 bus 4, a gate connected to a driver bus node 16', and a drain connected to the output terminal 13. A power transistor 18 has a source connected to the VDD2 bus 4, a gate connected to a driver bus node 16", and a drain connected to the output terminal 14. The load 15 is coupled between the output terminals 13 and 14. Power transistors 19 and 21 have their sources connected to the VSS2 bus 3, their gates connected to the driver bus nodes 16" and 16', respectively, and their drains connected to the output terminals 13 and 14, respectively. There are several types of power transistors which are suitable for use as the power transistors 17, 18, 19, and 21, including but not limited to lateral, vertical, and updrain DMOS transistors.

The power transistors 17, 18, 19, and 21 are manufacturable in a process which is similar to that of the microprocessor core 5, are efficient in silicon area required for layout, and have minimum power dissipation therein minimizing junction temperatures. N-type, lateral DMOS power transistors which have the aforementioned characteristics are used in the preferred embodiment of the present invention. As mentioned previously, the driver voltage controlling the power output driver circuit 9 has a magnitude greater than the supply voltage VDD2. The need for this is because the power transistors 17 and 18 are N-type and their gates must therefore be driven to a potential that is at least a threshold voltage above the potential of their sources (VDD2) in order to operate in the saturation region and thus minimize rdson.

If the load 15 is a DC motor, applying a high driver voltage at the gates of power transistors 17 and 21 will cause current to flow through the load in a forward direction (from output 13 to output 14) which will cause the DC motor to rotate in a forward direction. By applying a high driver voltage to the gates of power transistors 19 and 21 a reverse current flows through the DC motor (from output 14 to output 13) which causes the DC motor to rotate in a reverse direction. The current requirements of a fractional horsepower DC motor can easily exceed 0.25 amps which requires the power transistors 17, 18, 19, and 21 to have a very low rdson (typically below 1 ohm). A low rdson not only provides optimal motor operation, but also keeps the power dissipation in the power output driver 9 to a minimum which is necessary to limit the substrate temperature on which the microprocessor core 5 resides. Since the microprocessor core 5 controls the control and driver circuit 7 and hence the driver voltage, the driver voltage can be pulse width modulated to control the speed of the DC motor (load 15) or the amount of current flowing through the power output driver 9. This is especially useful since temperature information can be fed back to the microprocessor core 5 via the temperature sense circuit 8, and the microprocessor core 5 can then reduce the current flow through the power output driver 9 if the junction temperature exceeds a predetermined value.

Figure 3:
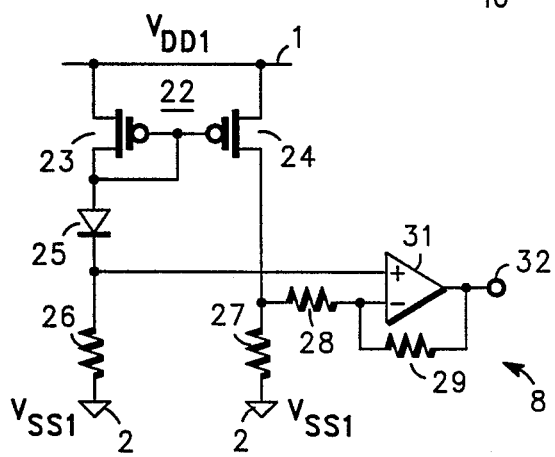
FIG. 3 is a schematic diagram of a temperature sense circuit.

An example of a circuit capable of sensing junction temperatures on a substrate is illustrated in FIG. 3. A current mirror 22 is formed by field effect transistors 23 and 24 wherein their sources are connected to the VDD1 bus 1, and their gates are connected to the drain of the field effect transistor 23. A diode 25 has an anode connected to the drain of the field effect transistor 23 and a cathode coupled to the VSS1 bus 2 via a resistor 26. The drain of the field effect transistor 24 is coupled to the VSS1 bus 2 via a resistor 27. The diode 25 is a temperature sensing diode in that it is located in the proximity of the power output driver 9 and its linear temperature coefficient is used to track changes in temperature. As the junction temperatures of the microprocessor-power integrated circuit 10 increase due to the current flowing in power output driver 9, the temperature of the diode 25 will change proportionately. It is well known that a forward biased PN junction has a forward voltage drop which varies by 2 milli Volt/C up to 125 C, given a constant current source (provided by the current mirror 22). As the temperature increases then, an increasing voltage differential is created between the drains of the field effect transistors 23 and 24.

The cathode of the diode 25 is connected to the noninverting input of an amplifier 31, and the drain of the field effect transistor 24 is connected to the inverting input of the amplifier 31 by a resistor 28. The output of the amplifier 31 is connected to a node 32 and further connected to the inverting input via a resistor 29. The difference in voltage between the noninverting and inverting inputs of the amplifier 31 is amplified with the amount of amplification determined by the ratio of the resistors 28 and 29. The node 32 is connected to the microprocessor core 5 via the data bus 6. If the temperature of the diode reaches a predetermined point, then the magnitude of the output at the node 32 will be an indication to the microprocessor core 5 to take corrective action. The corrective action from the microprocessor core 5 can be preprogrammed in ROM and may vary from a warning message, to reducing or shutting off the driver voltage to the power output driver 9.

Figure 4:
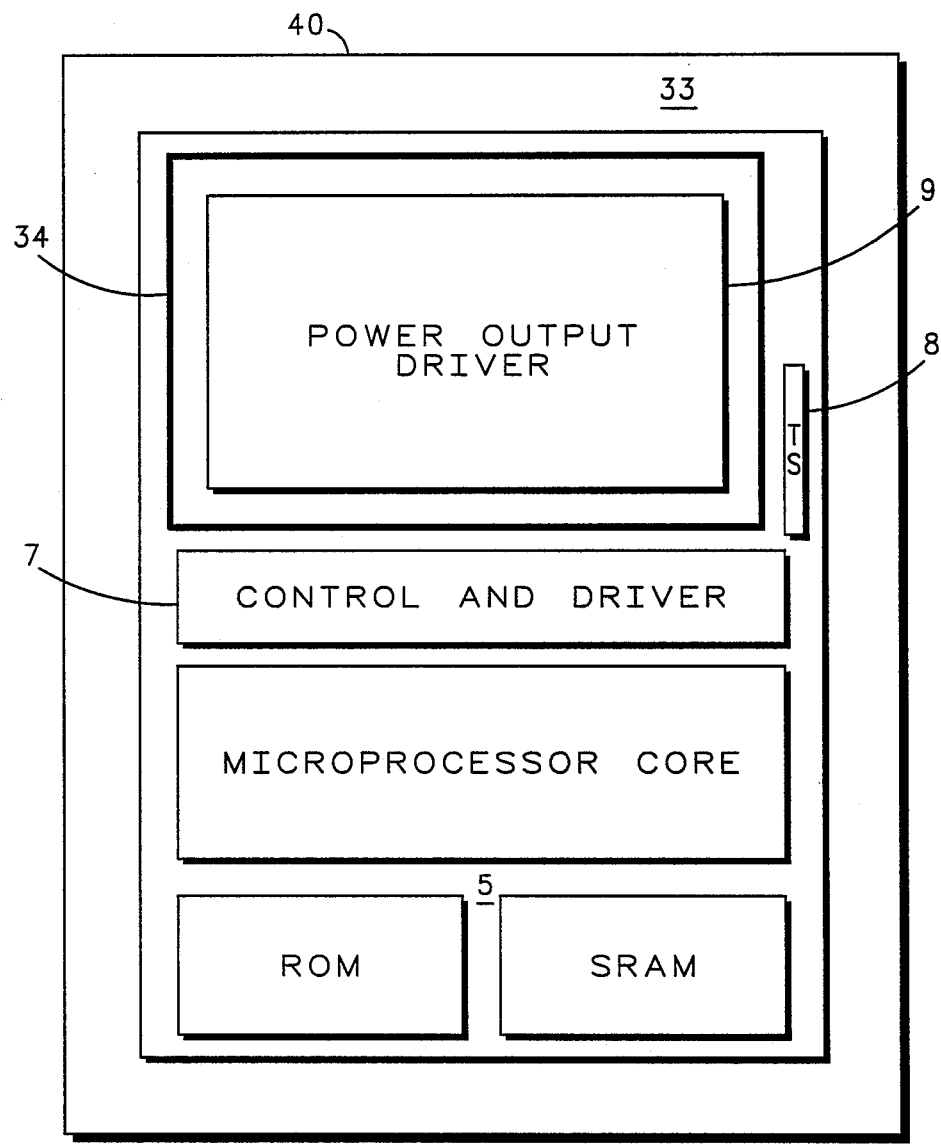
FIG. 4 is a block diagram of a cross sectional plan view of the integrated circuit layout of the present invention.

Because of the large current flowing through the power output driver 9, it is advantageous to physically locate the microprocessor core 5 at a the maximum distance from the power output driver 9. This is a result of both junction temperature and excessive parasitic substrate currents. FIG. 4 shows a floorplan of the microprocessor-power integrated circuit 10 wherein the major circuit blocks are shown as they are located relative to each other. The numbers used to identify structures in FIG. 1 are used in FIG. 4 to identify the same structures. The microprocessor core 5 is layed out in a manner that places the memory circuits at a maximum distance from the power output driver 9. The memory circuits, and especially the SRAM is particularly sensitive to high temperature and high substrate currents. This further allows the microprocessor core 5 to be arranged in the most suitable position. In other words having the least heat sensitive circuits of the microprocessor core 5 towards the power output driver 9 and the more heat sensitive circuits near the memory blocks. Least heat sensitive circuits include the I/O bus, while more heat sensitive circuits vary depending on the configuration of the microprocessor core.

The control and driver circuit 7 is located between the microprocessor core 5 and the power output driver 9 further buffering the two circuits. This is also the logical placement since the control and driver circuit receives its signals from the microprocessor core 5 and then drives the power output driver 9. The diode 25 of the temperature sense circuit 8 is located next to the power output driver 9. A deep guard ring 34 is shown surrounding the power output driver 9 which acts to collect the substrate currents. The deep guard ring 34 is connected to the VSS2 bus 3 and is made up of a p+ region diffused into a p-well (thus collecting substrate currents deeper in the substrate due to the increased depth and area of the p-well). The deep guard ring 34 is effective for collecting the potentially large parasitic substrate currents because it extends farther down into the substrate 40 than just a p+ ring. The deep guard ring 34 is an example of an effective isolation structure and it should be obvious to one skilled in the art to use modified structures as required in different technologies. The microprocessor core 5 is a predesigned standard cell block and represents a known processor to the industry. Cost and familiarity problems would make designing from scratch a microprocessor core just for this application very expensive. It is advantageous to thus merge the technology of the power output driver 9 in a way that does not require redesign of the microprocessor core 5.

Figure 5:
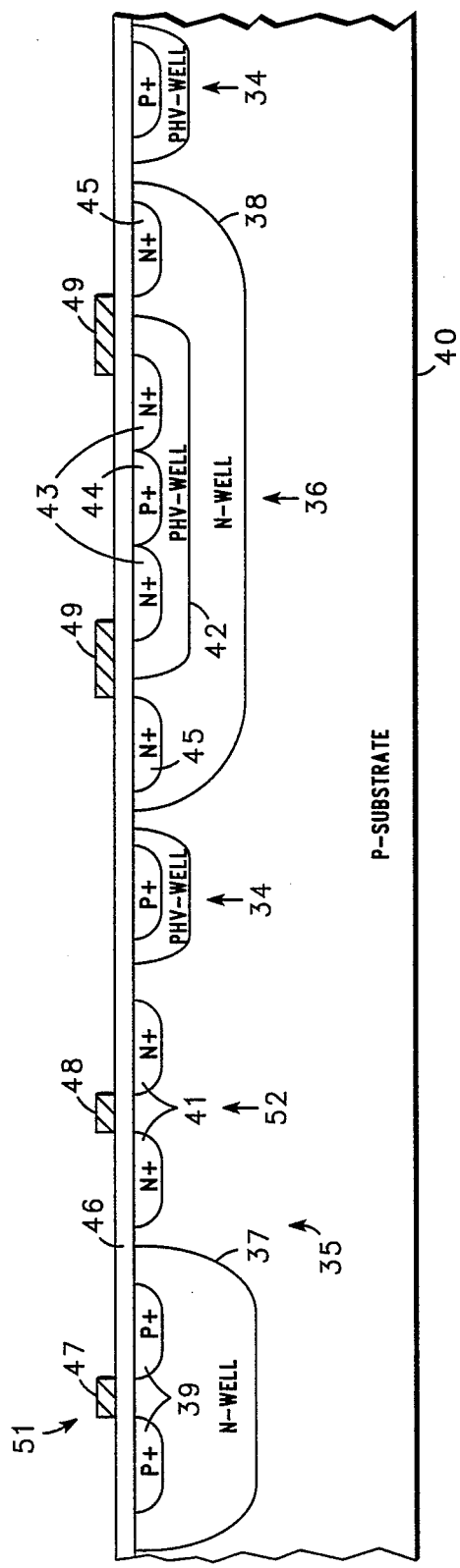
FIG. 5 shows in cross sectional view a portion of an integrated circuit of the present invention including a power device and a microprocessor core device.

Transistor structures of both the microprocessor core 5 and the power output driver 9 are shown in cross sectional view in FIG. 5 as devices 35 and 36, respectively. The devices 35 are typical of devices found in a standard N-well CMOS process. The device 36 uses the same structural elements as devices 35 with the addition of a PHV-well 42 (high voltage P-well) being formed in an N-well 38 and thus forming a portion of the power output driver 9. It is possible then, to build the microprocessor core 5 on the same substrate as the power output driver 9 by masking the devices 35 during the implanting of the PHV-well 42 so that the PHV-well 42 exists only in the device 36. Although an N-well process in a P-type substrate has been shown, it would be obvious to one skilled in the art that the complementary structure of P-wells in an N-type substrate is a viable alternate structure.

In the devices 35, the first region formed is an N-well 37 which is diffused into a substrate 40. Simultaneously, the N-well 38 in device 36 is also diffused into the substrate 40, with the doping concentrations of the N-wells 37 and 38 being equal and greater than the doping concentration of the substrate 40. The PHV-well 42 is then formed in the N-well 38 in the device 36 having a doping concentration which is greater than that of the N-well 38. P-type regions 39 and 44 are then formed in the N-well 37, and the PHV-well 42, respectively. N-type regions 41, 43, and 45 are simultaneously formed in the substrate 40, the PHV-well 42, and the N-well 38, respectively. The doping concentrations of the N-type regions 41, 43, and 45, and the P-type regions 39 and 44, are all greater than the doping concentration of the PHV-well 42. An oxide 46 is grown on the surface, and gates 47, 48, and 49 are deposited in a manner well known to those skilled in the art.

The P-type regions 39 in combination with the gate 47 form a p-type field effect transistor 51, and the N-type regions 41 in combination with the gate 48 form a N-type field effect transistor 52. These complementary field effect transistors 51 and 52 then form the necessary building blocks of the microprocessor core 5. A portion of the power output driver 9 is depicted as an N-type LDMOS device wherein the P-type region 44 provides an ohmic contact to the PHV-well 42 in order to back bias the source of the device 36. The N-type region 43 forms a donut shaped region which surrounds the P-type region 44. Similarly, the N-type region 45 forms a donut shaped area which surrounds the PHV-well 42. The gate 49 also forms a donut shaped between the N-type regions 43 and 45.

The device 36 is repeated to form an array in which all devices are then coupled in parallel to provide a power transistor. The guard ring 34 as shown in FIG. 4 surrounds the device 36 (or array of devices 36) and is made up of a P-type region formed in a PHV-well. As the number of devices in the array increases, so does the channel width of the power transistor. A low rdson is accomplished by the combination of the large channel width as provided for by the number of devices as and the efficiency of the structure of the device 36. The channel region of the device 36 is formed by the area of the PHV-well 42 and the N-well 38 under the gate 49. A current flows laterally along the surface (hence the term LDMOS) from the N-type region 43 to the N-type region 45. Because the current flow is lateral and not vertical to the substrate, it is possible to include several power transistors as used in the power output driver 9 on the same substrate. There are numerous variations of the device 36 which are suitable for this application.

By now it should be appreciated that there has been provided a microprocessor having large current drive capability, wherein integrated power devices are merged with the microprocessor core in a manner which minimizes the effects of heat and substrate currents on the microprocessor core's operation.

We claim:

1. A monolithically integrated circuit comprising:
   at least one power output device having a current drive capability of greater than 0.25 amps;
   a microprocessor core coupled to said at least one power output device for driving said at least one power output device, wherein said microprocessor core has a heat sensitive circuit which is more heat sensitive than other portions of said microprocessor core, and wherein said heat sensitive circuit is located at a distance remote from said at least one power output device in order to minimize the effects of heat dissipation from said at least one power output device.

2. The monolithically integrated circuit according to claim 1 wherein said at least one power output device has a rdson of less than 1 ohm.

3. The monolithically integrated circuit according to claim 1 wherein said heat sensitive circuit is located at a greater distance from said at least one power output device than said other portions of said microprocessor core.

4. The monolithically integrated circuit according to claim 3 further comprising an isolation means coupled to a voltage and located between said at least one power output device and said microprocessor core for collecting substrate currents.

5. The monolithically integrated circuit according to claim 4 wherein said microprocessor core, said at least one power output device, and said isolation means are manufacturable in a substantially similar CMOS process technology.

6. The monolithically integrated circuit according to claim 5 further comprising a control and driver circuit coupled between said microprocessor core and said power output device for providing a driver voltage to said at least one power output device wherein the magnitude of the driver voltage is greater than a first supply voltage applied thereto.

7. The monolithically integrated circuit according to claim 6 wherein said control and driver circuit is located between said microprocessor core and said at least one power output device.

8. A microprocessor circuit fabricated in a semiconductor substrate using a MOS process technology, for driving a load requiring greater than 0.25 amps of current, said microprocessor circuit comprising:
   at least one power output device exhibiting a rdson of less than 1 ohm;
   a microprocessor core having a heat sensitive circuit coupled for driving said at least one power output device, said heat sensitive circuit being more sensitive than said substantially all other circuits within said microprocessor core, said heat sensitive circuit located at a greater distance from said power output device than said other circuits; and
   an isolation means coupled to a voltage and located between said at least one power output device and said microprocessor core for collecting substrate currents.

9. The microprocessor circuit according to claim 8 wherein said isolation means comprises a doped region in said substrate between said at least one power output device and said microprocessor core.

10. The microprocessor circuit according to claim 9 wherein said substrate has a principle surface, and wherein said doped region extends to said principle surface.

11. The microprocessor circuit according to claim 10 further comprising a control and driver circuit coupled between said microprocessor core and said at least one power output device for providing a driver voltage to said at least one power output device wherein the magnitude of the driver voltage is greater than a first supply voltage applied thereto.

* * * * *